United States Patent
Fields, Jr. et al.

(10) Patent No.: US 9,348,518 B2
(45) Date of Patent: May 24, 2016

(54) BUFFERED AUTOMATED FLASH CONTROLLER CONNECTED DIRECTLY TO PROCESSOR MEMORY BUS

(71) Applicant: International Business Machines Corporation, Armonk, NY (US)

(72) Inventors: James S. Fields, Jr., Austin, TX (US); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 14/322,121

(22) Filed: Jul. 2, 2014

(65) Prior Publication Data
US 2016/0004457 A1    Jan. 7, 2016

(51) Int. Cl.
*G06F 12/00* (2006.01)
*G06F 3/06* (2006.01)
*G06F 12/08* (2016.01)
(Continued)

(52) U.S. Cl.
CPC ............ *G06F 3/0611* (2013.01); *G06F 3/0644* (2013.01); *G06F 3/0656* (2013.01); *G06F 3/0679* (2013.01); *G06F 12/0802* (2013.01); *G06F 2003/0691* (2013.01);
(Continued)

(58) Field of Classification Search
CPC ... G06F 3/0611; G06F 3/0656; G06F 3/0679; G06F 2212/1024; G06F 2212/7201; G06F 2003/0691
See application file for complete search history.

(56) References Cited

U.S. PATENT DOCUMENTS 6,173,385 B1    1/2001    Tuma et al.
6,697,923 B2    2/2004    Chen et al.
(Continued)

FOREIGN PATENT DOCUMENTS

JP    2009003569 A    1/2009
WO    WO9518407 A1    7/1995
(Continued)

OTHER PUBLICATIONS

List of IBM or Patent Applications Treated as Related (Appendix P), 2 pages.
(Continued)

*Primary Examiner* — Mark Giardino, Jr.
(74) *Attorney, Agent, or Firm* — Stephen R. Tkacs; Stephen J. Walder, Jr.; Randall J. Bluestone

(57) ABSTRACT

A mechanism is provided for buffer linking in a buffered solid state drive controller. Responsive to the buffered flash memory module receiving from a memory bus of a processor a memory command specifying a write operation, the mechanism initializes a first memory buffer in the buffered flash memory module. The mechanism associates the first memory buffer with an address of the write operation. The mechanism performs a compare operation to compare a previous and a next address with respect to an address associated with the first memory buffer with a plurality of buffers. The mechanism assigns a link tag to at least one buffer identified in the compare operation and the first memory buffer to form a linked buffer set. The mechanism writes to the first memory buffer based on the memory command. The mechanism builds at least one input/output command to persist contents of the linked buffer set and writes the contents of the linked buffer set to at least one solid state drive according to the at least one input/output command.

20 Claims, 4 Drawing Sheets

(51) Int. Cl.
*G06F 13/00* (2006.01)
*G06F 13/28* (2006.01)

(52) U.S. Cl.
CPC .. *G06F 2212/1024* (2013.01); *G06F 2212/222* (2013.01); *G06F 2212/7201* (2013.01)

(56) References Cited

U.S. PATENT DOCUMENTS

| | | |
|---|---|---|
| 7,359,244 B2 | 4/2008 | Kobayashi et al. |
| 7,412,546 B2 | 8/2008 | Basso et al. |
| 7,778,092 B2 | 8/2010 | Klein |
| 8,068,365 B2 | 11/2011 | Kim |
| 8,423,710 B1 * | 4/2013 | Gole ................ G06F 12/0246 711/103 |
| 2003/0196021 A1 | 10/2003 | Botchek |
| 2008/0162788 A1 | 7/2008 | Yu |
| 2008/0250194 A1 | 10/2008 | Chen |
| 2009/0172260 A1 | 7/2009 | Olbrich et al. |
| 2009/0222613 A1 | 9/2009 | Kurashige |
| 2010/0057976 A1 | 3/2010 | Lasser |
| 2010/0185808 A1 | 7/2010 | Yu et al. |
| 2010/0241792 A1 | 9/2010 | Lee |
| 2011/0208905 A1 | 8/2011 | Shaeffer et al. |

FOREIGN PATENT DOCUMENTS

| | | |
|---|---|---|
| WO | WO2007135077 B1 | 1/2008 |
| WO | WO2009049546 A1 | 4/2009 |

OTHER PUBLICATIONS

Response to the Combined Search and Examination Report, dated Jan. 23, 2013, Application No. GB1216336.6, 2 pages.

Sanvido, Marco A. et al., "NAND Flash Memory and Its Role in Storage Architectures", Proceedings of the IEEE, vol. 96, No. 11, Nov. 2008, pp. 1864-1874.

Wu, Guanying et al., "An Adaptive Write Buffer Management Scheme for Flash-Based SSDs", ACM Transactions on Storage, vol. 8, No. 1, Article 1, Feb. 2012, 24 pages.

* cited by examiner

BUFFERED AUTOMATED FLASH CONTROLLER CONNECTED DIRECTLY TO PROCESSOR MEMORY BUS

BACKGROUND

The present application relates generally to an improved data processing apparatus and method and more specifically to mechanisms for connecting a buffered automated flash controller directly to a processor memory bus.

A solid-state drive (SSD) is a data storage device that uses solid-state memory to store persistent data with the intention of providing access in the same manner of a traditional block I/O hard disk drive. SSDs are distinguished from traditional hard disk drives (HDDs), which are electromechanical devices containing spinning disks and movable read/write heads. SSDs, in contrast, use microchips that retain data in non-volatile memory chips and contain no moving parts. Compared to electromechanical HDDs, SSDs are typically less susceptible to physical shock, are quieter, and have lower access time and latency. However, many SSDs use the same interface as hard disk drives, such as serial attached SCSI (SAS), serial advanced technology attachment (SATA), and Fibre Channel, thus allowing both HDDs and SSDs to be used in the same enclosure and allowing applications to seamlessly take advantage of either. Using interfaces designed for HDDs results in added latency from several sources. First of all, if the SSD is out in the SAN, there are SAN fabric delays, and delays by the external storage controller for directory lookups and the like. For SSDs present on the PCI Express link, the most significant form of latency is actually software latency to go through the software driver and then wait for the DMA to complete and to process the completion status.

Some SSDs may be attached to peripheral component interconnect express (PCIe) interfaces. This is an effective way to reduce latency. Because non-volatile memories used in SSDs, i.e., Flash memories, are block oriented and require erases before they can be written to, software drivers use HDD access methods to write and read data. This involves building a scatter/gather list and sending control blocks to the PCIe card to tell the SSD where to fetch data and then completion status must be sent to the driver that the operation is finished. This method of interface results in significant added latency to build the scatter gather lists, send the command to the storage device, wait for the DMA to complete and finally the ending status.

SUMMARY

In one illustrative embodiment, a method is provided for buffer linking in a buffered solid state drive controller. The method comprises initializing a first memory buffer in the buffered flash memory module responsive to the buffered flash memory module receiving from a memory bus of a processor a memory command specifying a write operation. The method further comprises associating the first memory buffer with an address of the write operation. The method further comprises performing a compare operation to compare a previous and a next address with respect to an address associated with the first memory buffer with addresses associated with a plurality of memory buffers. The method further comprises assigning a link tag to at least one memory buffer identified in the compare operation and the first memory buffer to form a linked buffer set. The method further comprises writing to the first memory buffer based on the memory command. The method further comprises building at least one input/output command to the solid state drive or flash controller to persist contents of the linked buffer set. The method further comprises writing the contents of the linked buffer set to at least one solid state drive according to the at least one input/output command.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a solid-state drive is provided. The solid-state drive comprises a plurality of memory buffers, a solid-state memory, and a controller. The controller is configured to respond to receiving from a software application a request to access data at a memory address in the solid-state drive, convert the memory address to a logical block addressing (LBA) address, and perform an access operation to access a solid-state memory in the solid-state drive using the LBA address.

The solid-state drive may comprise one or more controllers and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for buffer linking in a buffered flash controller. Today, most flash memories are connected via input/output (IO) connections, such as serial attached small computer systems interface (SAS), Fibre Channel, serial attached advanced technology attachment (SATA), and in some cases peripheral component interconnect express (PCIE). Given the latency of flash, this has been the easiest way to connect. However, IO models experience significant software stack latencies in addition, because they were developed for the hard disk drive (HDD) technology. Therefore, connections on the memory bus have some merit.

Current attempts use simple double data rate (DDR3) to flash interface models, and management of sufficient throughput is left to the operating system or hypervisor (virtual machine manager). The illustrative embodiment provides a buffered flash controller that can interface to multiple underlying off-the-shelf solid state drives (SSDs) and also allow for very high throughput by automatically generating SSD commands. The buffered flash controller connects to a processor bus or memory bus of the processor. For example, the buffered flash controller may take commands from Direct Media Interface (DMI) or Scalable Memory Interconnect (SMI) from Intel® Corporation or Hypertransport™ from Advanced Micro Devices, Inc. or any other known or future memory bus commands. The buffered flash controller then automatically generates SSD commands based on the memory access commands to access the SSDs.

In addition, flash memory will achieve the highest bandwidth when large block transfers can be sent to the SSD. When processor memory is working at 4K or 8K pages at the largest, such large block transfers cannot be achieved. Therefore, many operations can be achieved, but not high throughput. The buffered flash controller of the illustrative embodiment achieves high throughput by automatically linking buffers together.

The buffered flash controller allows contiguous blocks that exist in any buffer in transit to be linked and sent in order to the solid state drives. The buffered flash controller associates each buffer with a logical memory address and a direction (read/write). As each buffer is assigned for a write, the buffered flash controller does a broadside compare to all other address registers that are in the write direction. The buffered flash controller then links the buffer to each buffer having the previous address and/or next address to form a linked buffer set. Responsive to a linked buffer set not having another linked operation within a predetermined period of time, the buffered flash controller builds one or more commands to write the contents of the buffers in order to the solid state drives.

Figure 1:
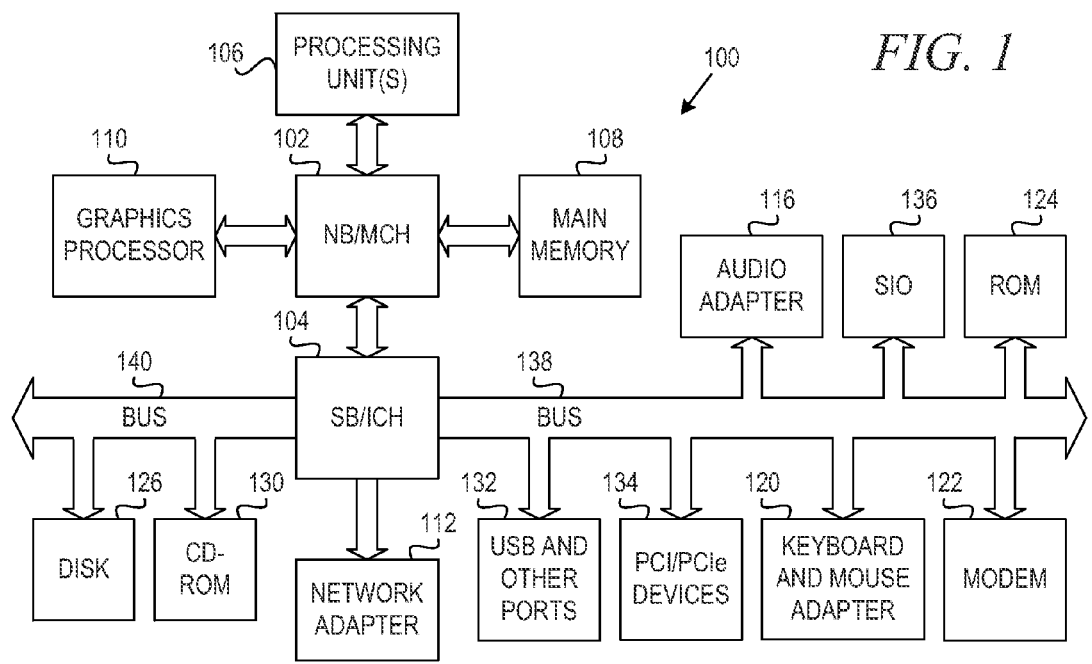
FIG. 1 is a block diagram of an example data processing system in which aspects of the illustrative embodiments may be implemented.

The illustrative embodiments may be utilized in many different types of data processing environments including a distributed data processing environment, a single data processing device, a storage system, an embedded computer system, or the like. In order to provide a context for the description of the specific elements and functionality of the illustrative embodiments, FIG. 1 is provided hereafter as an example environment in which aspects of the illustrative embodiments may be implemented. It should be appreciated that FIG. 1 is only an example and is not intended to assert or imply any limitation with regard to the environments in which aspects or embodiments of the present invention may be implemented. Many modifications to the depicted environments may be made without departing from the spirit and scope of the present invention.

FIG. 1 is a block diagram of an example data processing system in which aspects of the illustrative embodiments may be implemented. In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 100 (Java is a trademark of Oracle and/or its affiliates).

As a server, data processing system 100 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. The data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation. A solid-state drive (SSD) as described below with respect to the illustrative embodiments may be disk 126, may connect to PCI/PCIe devices 134, or may connect directly to bus 138, for example.

Figure 2:
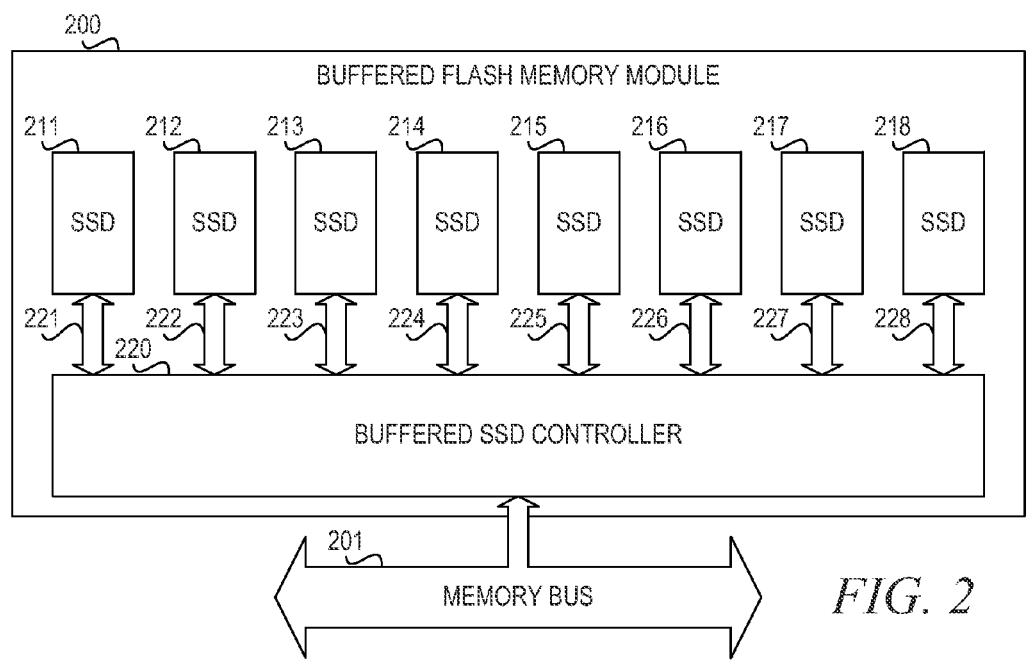
FIG. 2 is a block diagram of a buffered flash memory module in accordance with an illustrative embodiment.

FIG. 2 is a block diagram of a buffered flash memory module in accordance with an illustrative embodiment. Buffered flash memory module 200 connects to processor memory bus 201. The processor memory bus 201 may be DDR3, DDR4, or any known or future memory bus architecture. In an example embodiment, buffered flash memory module 200 may appear as a dual inline memory module (DIMM) to the processor (not shown).

Buffered flash memory module 200 comprises buffered SSD controller 220 and a plurality of SSDs 211-218. Buffered SSD controller 220 connects to SSDs 211-218 via IO connections 221-228. In an example embodiment, IO connects 221-228 are SATA buses. Buffered SSD controller 220 receives direct memory commands from memory bus 201, buffers them, and converts the memory commands to IO commands. For example, buffered SSD controller 220 may convert the memory commands to SATA, SAS, Fibre Channel, or PCIE commands. In one embodiment, buffered SSD controller 220 reads from and writes to SSDs 211-218 in pages.

SSDs 211-218 may comprise a controller and flash memory (not shown). SSDs 211-218 may be standard off-the-shelf SSDs. In an example embodiment, buffered flash memory module 200 may support up to 2.8 TB of total useable capacity, although the storage capacity may be more or less depending upon the implementation. One of SSDs 211-218 may be a spare to extend the life of buffered flash memory module 200. Thus, buffered flash memory module 200 may be replaced only when two of SSDs 211-218 have failed. An SSD may be determined to have failed if its controller or flash memory has failed, for example.

Buffered SSD controller 220 may assure that a full minimum number of transfers occur by buffering the transfers until a buffer's worth can be sent to an SSD. Buffered SSD controller 220 deterministically assigns address ranges to buffers such that striping is automatic and requires no mapping information. That is, buffered SSD controller 220 may assign address ranges to SSDs by mapping memory addresses to logical block addresses using a simple modulo operation based on the page size.

Buffered SSD controller 220 balances buffer size and the number of drives to which data are striped to support expected queue depths of the SSDs. Each SSD has a queue depth to allow a plurality of simultaneous reads and writes. Buffered SSD controller 220 performs a number of IO commands to each SSD, which are queued in the SSD. When the SSD queue is full, the SSD cannot accept any more IO commands until a number of queued IO commands are completed. Buffered SSD controller 220 leverages the size of buffers, the number of SSDs to which data are striped, and the SSD queue lengths to sustain many parallel IO commands to keep up with the bandwidth demand of the memory bus. In one example embodiment, buffered SSD controller 220 supports queue depths of 32 for each SSD 211-218 by virtue of the buffer size and number of SSDs.

Buffered SSD controller 220 also supports automatic injection and checking of data integrity information due to deterministic assignment of sectors in SSDs 211-218. Data integrity information can be checked in the SSD. Data integrity information may comprise cyclical redundancy check (CRC), logical block address (LBA) check, or T10 dif information appended to or injected into data being written or read from SSDs 211-218.

Buffered SSD controller 220 automatically builds IO commands when a buffer is full. This is true in either direction (write/read). After a buffer is persisted to the SSD, the buffer is put on a free list so that it can hold new data received in either direction.

Figure 3:
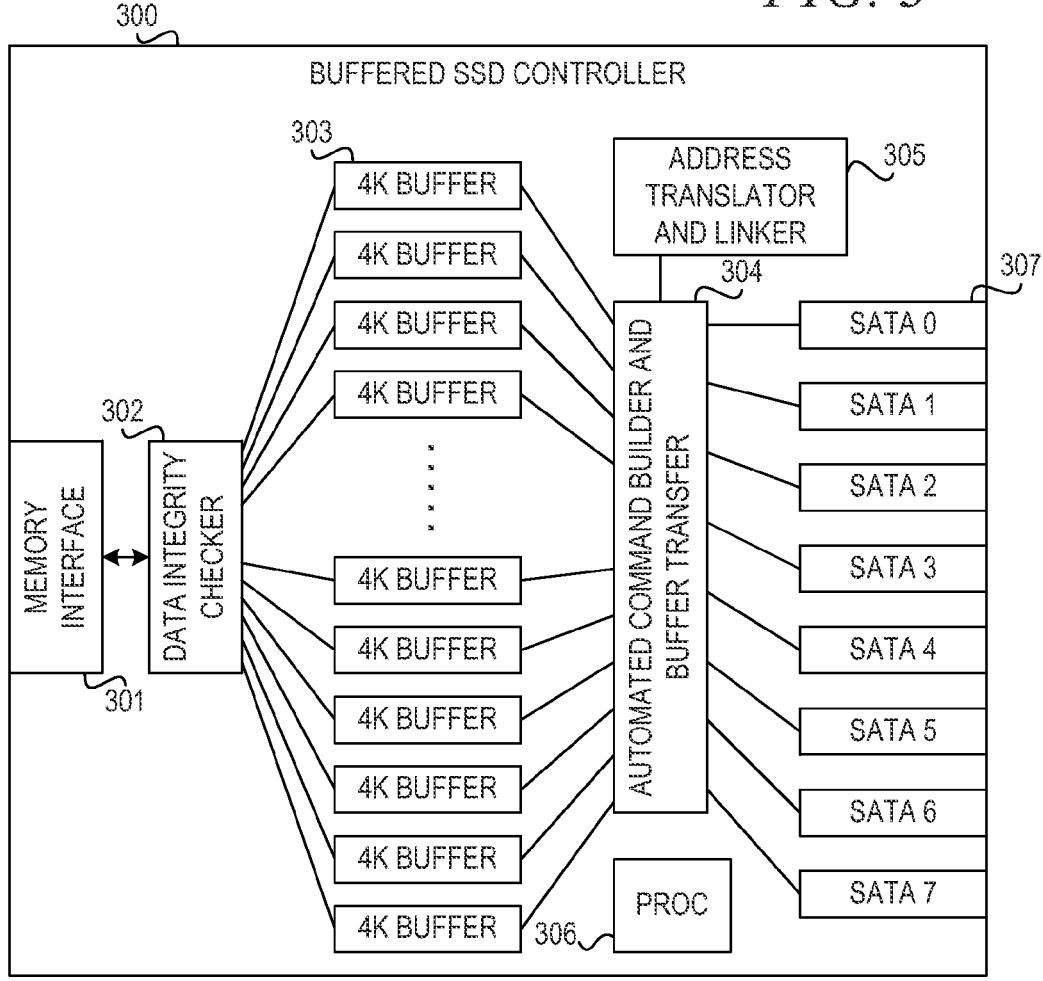
FIG. 3 is a block diagram of a buffered SSD controller in accordance with an illustrative embodiment.

FIG. 3 is a block diagram of a buffered solid state drive controller in accordance with an illustrative embodiment. Buffered solid state drive (SSD) controller 300 comprises memory interface 301, data integrity checker 302, a plurality of buffers 303, processor 306, automated command builder and buffer transfer component 304, address translator and linker 305, and IO interfaces 307. Buffered SSD controller 300 receives memory commands from a memory bus of a processor (not shown) via memory interface 301. The memory bus may be a DDR3, DDR4, or any known or future memory bus architecture. The buffered flash controller may take commands from Direct Media Interface (DMI) or Scalable Memory Interconnect (SMI) from Intel® Corporation or Hypertransport™ from Advanced Micro Devices, Inc. or any other known or future memory bus commands.

Data integrity checker 302 appends data integrity checking information, such as cyclical redundancy check (CRC), logical block address (LBA) check, or T10 dif, for data received from memory interface 301 to be written and performs data integrity checking for data being read via IO interfaces 307. In one example embodiment, IO interfaces 307 are serial advanced technology attachment (SATA) interfaces; however, IO interfaces 307 may be other interfaces, such as Fibre Channel or SAS interfaces, for example.

In one example embodiment, buffered SSD controller 300 comprises enough buffers 303 to allow queue depth of four for 64K transfer size of 4K buffer size to seven SSDs. This would allow for 448 buffers. Each buffer would have an associated logical memory address and a direction (read/write). Thus, each buffer has an associated address register (not shown) and a direction register (not shown).

As processor 306 assigns new buffers, processor 306 checks to see if the direction is write. If the direction is write, the buffered SSD performs a broadside compare to all other address registers that are in the write direction. Processor 306 may use a content addressable memory (CAM) (not shown) or combinatorial logic to perform the broadside compare. Processor 306 compares the previous address and the next address of the buffer to be written to all valid addresses in the write direction. Based on this compare, processor 306 links matching buffers together.

Processor 306 associates a link tag register of N bits with each buffer 303, where the maximum number represented by the N bits exceeds the number of buffers. There may be a pool of link tags, and processor 306 takes a link tag from the pool to assign the link tag to the first two buffers to be linked. Processor 306 adds each subsequent buffer to a linked buffer set by assigning the link tag of the set to the new buffer. It is possible to have two sets of linked buffers linked by a new buffer the address of which is between the two sets. If so, processor 306 puts one of the link tags on the free list and assigns the other link tag to the new buffer and both sets to form one linked buffer set.

Processor 306 gives each linked buffer set a predetermined time for another link operation. If the predetermined period of time passes without a link operation for a linked buffer set or an individual buffer, processor 306 passes the linked buffer set to automated command builder and buffer transfer component 304 to be written to SSDs. If a buffer being written is part of a linked buffer set, then automated command builder 304 builds a command for the length representing the number of buffers that are linked. After automated command builder and buffer transfer component 304 sends the commands to IO interfaces 307, processor 306 retires the link tags.

The programmable time to look for linkage is balanced against the size of the work queue for the drives. If the drives do not have enough work, then buffered SSD controller 300 writes buffers to the SSDs at shorter time values. Once written, the buffers are freed as well as the link tags.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
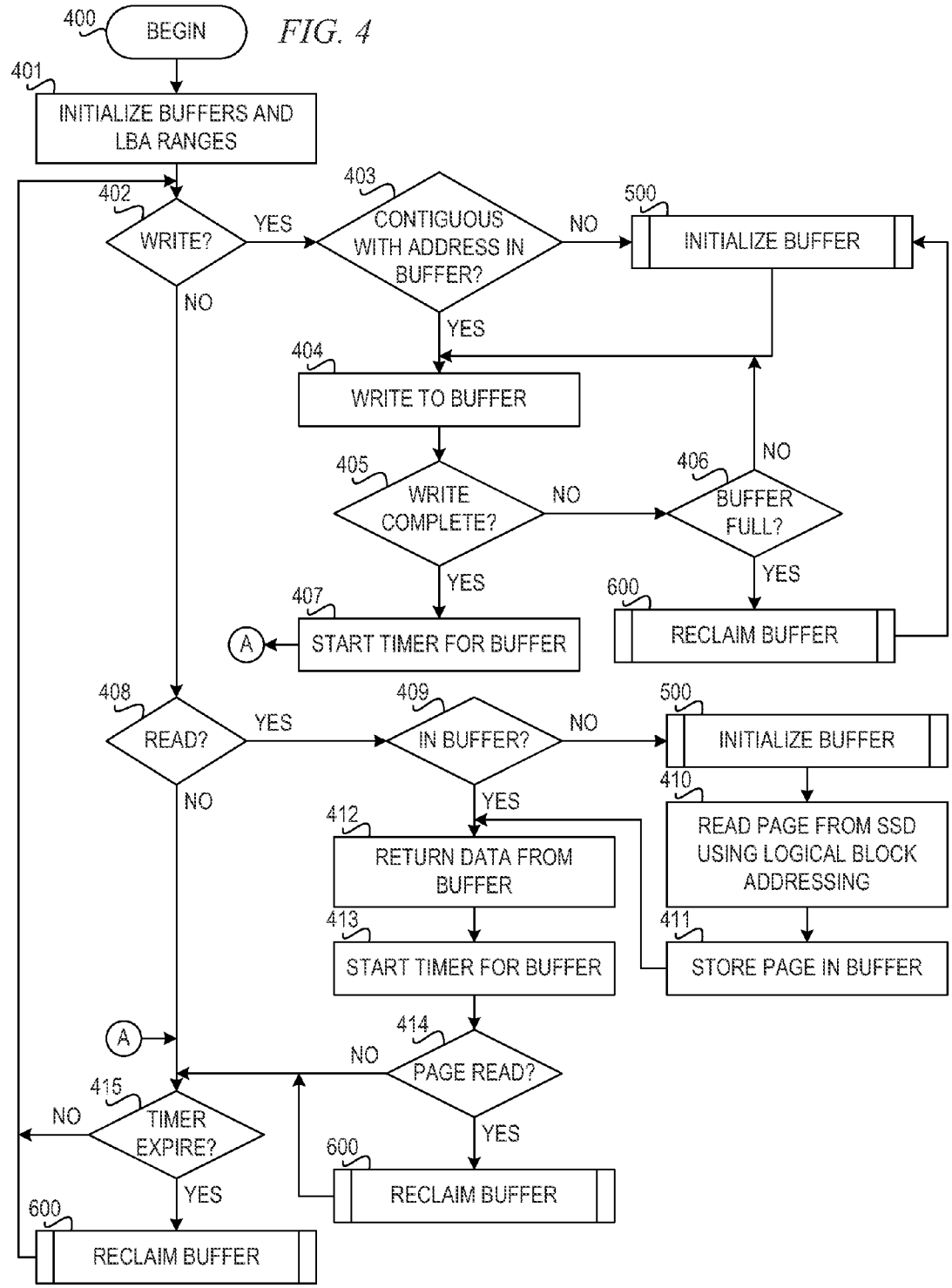
FIG. 4 is a flowchart illustrating operation of a buffered solid state drive controller in accordance with an illustrative embodiment.

FIG. 4 is a flowchart illustrating operation of a buffered flash controller in accordance with an illustrative embodiment. Operation begins in block 400, and the controller initializes buffers and maps a window of memory addresses to a range of logical block addressing (LBA) blocks (block 401). The host accesses the window of memory addresses as if it is reading and writing to memory. The controller then converts the memory addresses to LBA blocks and persists the data in the buffers to the solid-state drive (SSD) memory in the background, transparent to the host. The controller lists all available buffers in a free list.

The controller determines whether it receives a write request accessing a memory address within the window of memory addresses from the memory bus (block 402). If the controller receives a write request, the controller determines whether the write request accesses a memory address contiguous with an address in a buffer (block 403). If the write request does not access a memory address that is contiguous with an address in a buffer, the controller initializes a buffer (block 500). Operation of initializing a buffer is described in further detail below with reference to FIG. 5.

Thereafter, or if the write request does access a memory address that is contiguous with an address in a buffer in block 403, the controller writes data to the buffer based on the memory address of the write request (block 404). As described in further detail below, when initializing a buffer, the controller associated the buffer with a memory address range and a timer. The controller services the write request by writing the write data to the buffer according to the memory address range The controller then determines whether the write is complete (block 405). If the write is not complete, the controller determines whether the buffer is full or at least a predetermined percentage full (block 406). If the buffer is not full, operation returns to block 404 to continue writing to the buffer. If the buffer is full in block 406, the controller reclaims the current buffer (block 600), and operation returns to block 500 to initialize a new buffer. Operation of reclaiming a buffer is described in further detail below with reference to FIG. 6.

If the write is complete in block 405, the controller starts the timer associated with the buffer (block 407). In this example, the timer records the amount of time since the last access to the buffer. Thereafter, operation proceeds to block 415 to determine whether a timer associated with a buffer expires.

If the controller does not receive a write request in block 402, the controller determines whether it receives a read request accessing a memory address within the window of memory addresses (block 408). If the controller receives a read request, the controller determines whether the memory address is within an address range associated with a buffer (block 409). If the memory address is not associated with a buffer, the controller initializes a buffer (block 500). The controller then reads a page from the SSD memory using logical block addressing according to the mapping (block 410) and stores the page in the buffer (block 411).

Thereafter, or if the memory address is in the address range associated with a buffer, the controller returns data from the buffer (block 412) and starts the timer associated with the buffer (block 413). The controller then determines whether the read access completes reading the full page from the buffer (block 414). If the read access completes reading the page, the controller reclaims the buffer (block 600). Thereafter, or if the read access does not complete reading the full page from the buffer in block 414, operation proceeds to block 415 to determine whether a timer associated with a buffer expires.

Responsive to the controller not receiving a read request in block 408, the controller determines whether a timer associated with a buffer expires in block 415. If a timer associated with a buffer expires, the controller reclaims the buffer (block 600). Thereafter, or if the controller determines that no timer associated with a buffer expires in block 415, operation returns to block 402 to determine whether the controller receives a read request.

Figure 5:
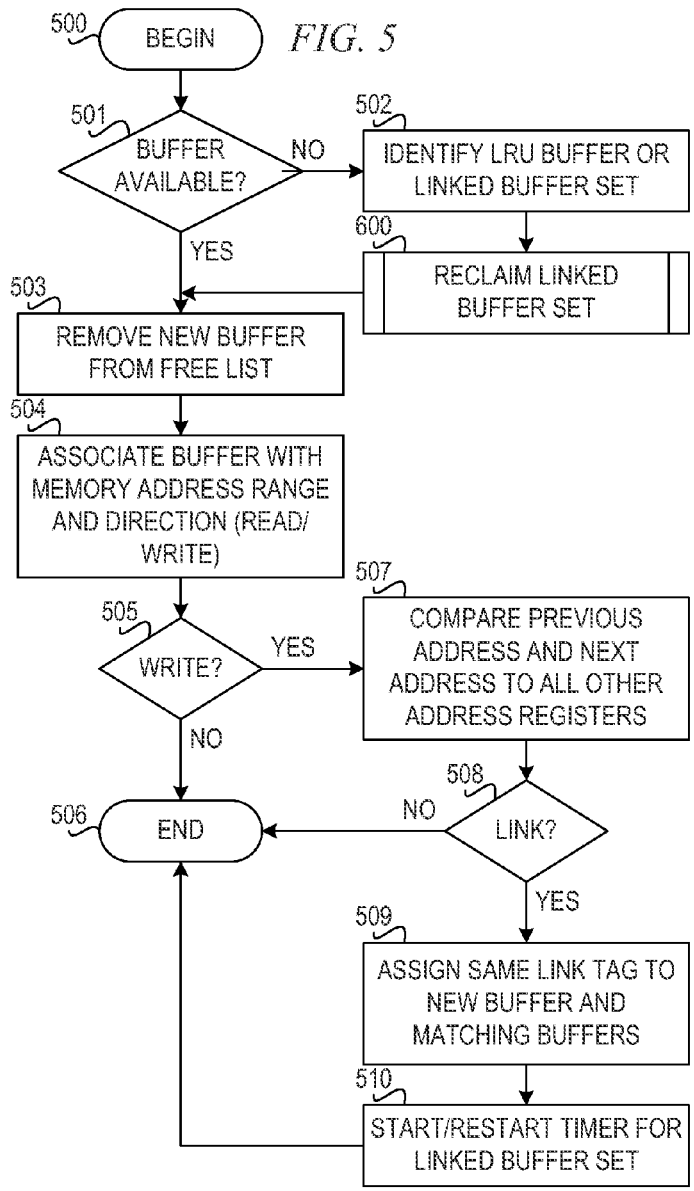
FIG. 5 is a flowchart illustrating operation of a buffered solid state drive controller for initializing a buffer in accordance with an illustrative embodiment.

FIG. 5 is a flowchart illustrating operation of a buffered solid state drive controller for initializing a buffer in accordance with an illustrative embodiment. Operation begins in block 500, and the controller determines whether a buffer is available (block 501). The controller determines whether a buffer is available by checking a free list. If the free list is empty, meaning a buffer is not available, then the controller identifies a least recently used (LRU) buffer or lined buffer set (block 502). The controller then reclaims the buffer (block 600).

Thereafter, or if a buffer is available, the controller removes a buffer from the free list (block 503). The controller then associates the buffer with a memory address range and a direction (read/write) (block 504). The controller determines whether the direction is write (block 505). If the direction is not write, then operation ends (block 506).

If the direction is write in block 505, the controller compares the previous address and the next address to all other address registers (block 507). The controller then determines whether the comparison identifies buffers to link (block 508). If the controller does not identify buffers to link, then operation ends (block 506).

If the controller identifies buffers to link in block 508, the controller assigns the same link tag to the new buffer and the matching buffer or buffer sets (block 509). Matching buffers may be an individual buffer, a buffer in a linked buffer set having an address matching the previous address, a buffer in a linked buffer set having an address matching the next address, or a combination thereof. The controller then starts a timer for the resulting linked buffer set (block 510). Thereafter, operation ends (block 506).

Figure 6:
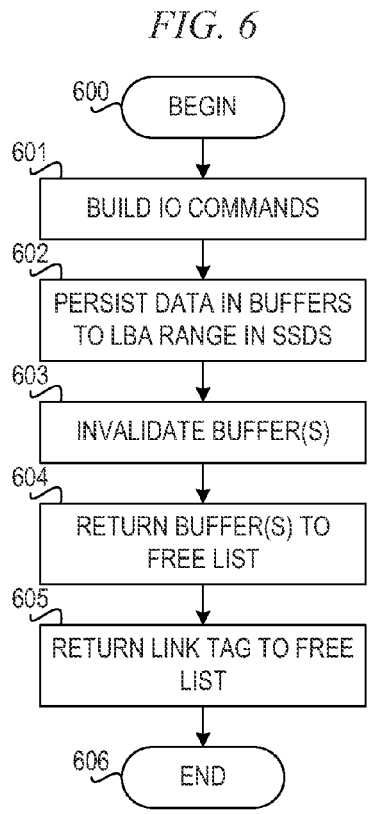
FIG. 6 is a flowchart illustrating operation of a buffered solid state drive controller for reclaiming a linked buffer set in accordance with an illustrative embodiment.

FIG. 6 is a flowchart illustrating operation of a buffered solid state drive controller for reclaiming a linked buffer set in accordance with an illustrative embodiment. Operation begins in block 600, and the controller builds IO commands to write contents of the linked buffer set to the SSDs (block 601). The IO commands may be, for example, serial advanced technology attachment (SATA) commands. The controller then persists data in the buffer to the solid-state drives using the IO commands (block 602). The controller then invalidates the data in the buffer or linked buffer set (block 603), returns the buffer or buffers to the free list (block 604), and returns the link tag to the free list (block 605). Thereafter, operation ends in block 606.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a computer readable storage medium having a computer readable program stored therein, wherein the computer readable program, when executed on a controller in a storage device, causes the controller to:
   responsive to the buffered flash memory module receiving from a memory bus of a processor a memory command specifying a write operation, initialize a first memory buffer in the buffered flash memory module;
   associate the first memory buffer with an address of the write operation;
   perform a compare operation to compare a previous and a next address with respect to an address associated with the first memory buffer with addresses associated with a plurality of memory buffers;
   assign a link tag to at least one memory buffer identified in the compare operation and the first memory buffer to form a linked buffer set;
   write to the first memory buffer based on the memory command;
   build at least one input/output command to persist contents of the linked buffer set; and
   write the contents of the linked buffer set to at least one solid state drive according to the at least one input/output command.

2. The computer program product of claim 1, wherein the computer readable program further causes the controller to:
   associate the link tag with a first timer;
   responsive to assigning the link tag to the first memory buffer, restart the first timer; and
   responsive to the first timer expiring without a link operation, build the at least one input/output command and write the contents of the linked buffer set to at least one solid state drive.

3. The computer program product of claim 1, wherein the at least one input/output command comprises a serial attached SCSI (SAS) command, serial advanced technology attachment (SATA) command, or a Fibre Channel command.

4. The computer program product of claim 1, wherein the computer readable program further causes the controller to:
   responsive to receiving from the memory bus a memory command specifying a read operation having a read address within an address range of a given memory buffer in the storage device, read from the given memory buffer.

5. The computer program product of claim 4, wherein the computer readable program further causes the controller to:
   responsive to the read address not being within an address range of a given memory buffer, initialize a second memory buffer in the buffered flash memory module;
   build at least one input/output read command to read from a target solid state drive in the buffered flash memory module;
   read a portion of data from the target solid state drive to the second memory buffer; and
   perform the read operation from the second memory buffer based on the memory command.

6. The computer program product of claim 1, wherein assigning a link tag to the at least one buffer identified in the compare operation and the first memory buffer comprises removing the link tag from a pool of available link tags.

7. The computer program product of claim 1, wherein the computer readable program further causes the controller to associate the first memory buffer with a read or write direction;
   wherein performing the compare operation comprises performing a first compare operation to compare a next address with respect to the address associated with the first memory buffer with addresses associated with a plurality of buffers associated with the write direction to identify a first linked buffer set; and
   wherein assigning the link tag comprises assigning a link tag associated with the first linked buffer set to the first memory buffer.

8. The computer program product of claim 7, wherein performing the compare operation comprises performing a second compare operation to compare a previous address with respect to the address associated with the first memory buffer with the plurality of buffers associated with the write direction to identify a second linked buffer set; and
   wherein assigning the link tag comprises assigning the link tag associated with the first memory buffer to the second linked buffer set.

9. The computer program product of claim 1, wherein the computer readable program further causes the controller to associate the first memory buffer with a read or write direction;
   wherein performing the compare operation comprises performing a first compare operation to compare a previous address with respect to the address associated with the first memory buffer with a plurality of buffers associated with the write direction to identify a first linked buffer set; and
   wherein assigning the link tag comprises assigning a link tag associated with the first linked buffer set to the first memory buffer.

10. The computer program product of claim 1, wherein the computer readable program further causes the controller to:
    responsive to writing the contents of the linked buffer set, invalidate memory buffers in the linked buffer set, return the memory buffers to a free list of available memory buffers, and return the link tag to a free list of available link tags.

11. A buffered solid state drive controller, comprising:
a memory interface;
a plurality of memory buffers;
a plurality of input/output interfaces;
a command builder and buffer transfer component; and
a processor, wherein the controller is configured to:
responsive to receiving from the memory interface a memory command specifying a write operation, initialize a first memory buffer in the buffered flash memory module;
associate the first memory buffer with an address of the write operation;
perform a compare operation to compare a previous and a next address with respect to an address associated with the first memory buffer with addresses associated with the plurality of memory buffers;
assign a link tag to at least one memory buffer identified in the compare operation and the first memory buffer to form a linked buffer set; and
write to the first memory buffer based on the memory command;
wherein the command builder and buffer transfer component is configured to:
build at least one input/output command to persist contents of the linked buffer set; and
transfer contents of the linked buffer set to at least one solid state drive via the plurality of input/output interfaces according to the at least one input/output command.

12. The buffered solid state drive controller of claim 11, wherein the processor is further configured to:
associate the link tag with a first timer;
responsive to assigning the link tag to the first memory buffer, restart the first timer; and
responsive to the first timer expiring without a link operation, build the at least one input/output command and write the contents of the linked buffer set to at least one solid state drive.

13. The buffered solid state drive controller of claim 11, wherein the at least one input/output command comprises a serial attached SCSI (SAS) command, serial advanced technology attachment (SATA) command, or a Fibre Channel command.

14. The buffered solid state drive controller of claim 11, wherein assigning a link tag to the at least one buffer identified in the compare operation and the first memory buffer comprises removing the link tag from a pool of available link tags.

15. The buffered solid state drive controller of claim 11, wherein the processor is further configured to associate the first memory buffer with a read or write direction;
wherein performing the compare operation comprises performing a first compare operation to compare a next address with respect to the address associated with the first memory buffer with addresses associated with a plurality of buffers associated with the write direction to identify a first linked buffer set; and
wherein assigning the link tag comprises assigning a link tag associated with the first linked buffer set to the first memory buffer.

16. The buffered solid state drive controller of claim 15, wherein performing the compare operation comprises performing a second compare operation to compare a previous address with respect to the address associated with the first memory buffer with the plurality of buffers associated with the write direction to identify a second linked buffer set; and
wherein assigning the link tag comprises assigning the link tag associated with the first memory buffer to the second linked buffer set.

17. The buffered solid state drive controller of claim 11, wherein the processor is further configured to:
responsive to writing the contents of the linked buffer set, invalidate memory buffers in the linked buffer set, return the memory buffers to a free list of available memory buffers, and return the link tag to a free list of available link tags.

18. A method for buffer linking in a buffered solid state drive controller, the method comprising:
responsive to the buffered flash memory module receiving from a memory bus of a processor a memory command specifying a write operation, initializing a first memory buffer in the buffered flash memory module;
associating the first memory buffer with an address of the write operation;
performing a compare operation to compare a previous and a next address with respect to an address associated with the first memory buffer with addresses associated with a plurality of memory buffers;
assigning a link tag to at least one memory buffer identified in the compare operation and the first memory buffer to form a linked buffer set;
writing to the first memory buffer based on the memory command;
building at least one input/output command to persist contents of the linked buffer set; and
writing the contents of the linked buffer set to at least one solid state drive according to the at least one input/output command.

19. The method of claim 18, further comprising:
associating the link tag with a first timer;
responsive to assigning the link tag to the first memory buffer, restarting the first timer; and
responsive to the first timer expiring without a link operation, building the at least one input/output command and writing the contents of the linked buffer set to at least one solid state drive.

20. The method of claim 18, further comprising:
associating the first memory buffer with a read or write direction;
wherein performing the compare operation comprises performing a first compare operation to compare a next address with respect to the address associated with the first memory buffer with addresses associated with a plurality of buffers associated with the write direction to identify a first linked buffer set;
wherein assigning the link tag comprises assigning a link tag associated with the first linked buffer set to the first memory buffer;
wherein performing the compare operation further comprises performing a second compare operation to compare a previous address with respect to the address associated with the first memory buffer with the plurality of buffers associated with the write direction to identify a second linked buffer set; and
wherein assigning the link tag comprises assigning the link tag associated with the first memory buffer to the second linked buffer set.

* * * * *